US010256946B2

(12) United States Patent
Calabro

(10) Patent No.: US 10,256,946 B2
(45) Date of Patent: Apr. 9, 2019

(54) CYCLE SLIP RESILIENT CODED MODULATION FOR FIBER-OPTIC COMMUNICATIONS

(71) Applicant: Xieon Networks S.a.r.l., Senningerberg (LU)

(72) Inventor: Stefano Calabro, Munich (DE)

(73) Assignee: Xieon Networks S.à.r.l., Luxembourg (LU)

(*) Notice: Subject to any disclaimer, the term of this patent is extended or adjusted under 35 U.S.C. 154(b) by 0 days.

(21) Appl. No.: 15/318,603

(22) PCT Filed: Jun. 22, 2015

(86) PCT No.: PCT/EP2015/063933
§ 371 (c)(1),
(2) Date: Dec. 13, 2016

(87) PCT Pub. No.: WO2016/012170
PCT Pub. Date: Jan. 28, 2016

(65) Prior Publication Data
US 2017/0134120 A1 May 11, 2017

(30) Foreign Application Priority Data

Jul. 25, 2014 (EP) .................... 14178516

(51) Int. Cl.
*H04L 1/00* (2006.01)
*H03M 13/27* (2006.01)
(Continued)

(52) U.S. Cl.
CPC ...... *H04L 1/0055* (2013.01); *H03M 13/2792* (2013.01); *H03M 13/2927* (2013.01);
(Continued)

(58) Field of Classification Search
CPC ............. H04L 1/0054; H04L 1/0055; H04L 2027/0057; H04L 2027/0067; H04L 25/067
(Continued)

(56) References Cited

U.S. PATENT DOCUMENTS 5,535,228 A * 7/1996 Dong ................. H03M 13/098
375/242
6,005,897 A * 12/1999 McCallister ........ H03M 13/253
375/265
(Continued)

FOREIGN PATENT DOCUMENTS

EP 2506516 A1 10/2012

OTHER PUBLICATIONS

International Search Report and Written Opinion, PCT/EP2015/063933, dated Sep. 22, 2015, 16 pages.
(Continued)

Primary Examiner — James C Kerveros
(74) Attorney, Agent, or Firm — Nelson Mullins Riley & Scarborough LLP

(57) ABSTRACT

Disclosed is a method for decoding an optical data signal. Said optical data signal is phase and amplitude modulated according to a constellation diagram with at least eight constellation points representing non-binary symbols. Said decoding method comprises the following steps: —carrying out a carrier phase recovery of a received signal ignoring the possible occurrence of phase slips, —decoding said signal after phase recovery, wherein in said decoding, possible cycle slips occurring during phase recovery are modelled as virtual input to an equivalent encoder assumed by the decoding scheme. Further disclosed are a related encoding method as well as a receiver and a transmitter.

23 Claims, 6 Drawing Sheets

(51) Int. Cl.
| H03M 13/29 | (2006.01) |
| H03M 13/39 | (2006.01) |
| H03M 13/45 | (2006.01) |
| H04B 10/61 | (2013.01) |
| H04J 14/02 | (2006.01) |
| H04B 10/516 | (2013.01) |
| H04B 10/548 | (2013.01) |

(52) U.S. Cl.
CPC ....... *H03M 13/3905* (2013.01); *H03M 13/45* (2013.01); *H04B 10/5161* (2013.01); *H04B 10/548* (2013.01); *H04B 10/612* (2013.01); *H04B 10/6165* (2013.01); *H04L 1/0041* (2013.01); *H04L 1/0058* (2013.01); *H04L 1/0071* (2013.01); *H04J 14/02* (2013.01)

(58) Field of Classification Search
USPC .................................................. 714/755, 780
See application file for complete search history.

(56) References Cited

U.S. PATENT DOCUMENTS

| 6,392,500 | B1 * | 5/2002 | McCallister | H03M 13/25 332/103 |
| 6,795,512 | B1 * | 9/2004 | Eidson | H04L 1/0054 375/262 |
| 2005/0129147 | A1 * | 6/2005 | Cannon | H04L 1/0045 375/324 |
| 2009/0019335 | A1 * | 1/2009 | Boyer | H03M 13/1105 714/755 |
| 2009/0249163 | A1 * | 10/2009 | Ovchinnikov | H03M 13/2972 714/755 |
| 2012/0266040 | A1 | 10/2012 | Hamkins | |
| 2013/0343485 | A1 * | 12/2013 | Eliaz | H04L 25/03178 375/298 |
| 2014/0050493 | A1 * | 2/2014 | Sigron | H04B 10/6165 398/202 |
| 2015/0326253 | A1 * | 11/2015 | Bisplinghoff | H03M 13/1111 714/776 |
| 2016/0065315 | A1 * | 3/2016 | Koike-Akino | H04B 10/6165 398/44 |

OTHER PUBLICATIONS

Leoni, P. et al., "Constellation Expansion for Differentially Encoded 100G Transmission," IEEE Photonics Technology Letters, vol. 26(11): 1142-1145 (2014).
Yoshida, T. et al., "Cycle Slip Compensation with Polarization Block Coding for Coherent Optical Transmission," IEEE Signal Processing Magazine, vol. 31(2): 57-69 (2014).
Zhang, S. et al., "Pilot-Assisted Decision-Aided Maximum-Likelihood Phase Estimation in Coherent Optical Phase-Modulated Systems With Nonlinear Phase Noise," IEEE Photonics Technology Letters, vol. 22(6): 380-382 (2010).
Bahl, L. R. et al., "Optimal Decoding of Linear Codes for Minimizing Symbol Error Rate," IEEE Transactions on Information Theory, pp. 284-287 (Mar. 1974).
Barbieri, A. et al., "Soft-Output Detection of Differentially Encoded M-PSK Over Channels with Phase Noise," 14th European Signal Processing Conference (EUSIPCO 2006), Florence, Italy, 5 pages (Sep. 4-8, 2006).
Castrillo, M. et al., "A New Cycle Slip Compensation Technique for Ultra High Speed Coherent Optical Communications," Laboratorio de Comunicaciones Digitales—Universidad Nacional de Cordoba—CONICET, 2 pages (2011).
Colavolpe, G. et al., "Iterative Joint Detection and Decoding for Communications Under Random Time-varying Carrier Phase," ESA Study Contract Report, Contract No. 17337/03/NL/LvH, vol. I/I, 67 pages (2004).
Colavolpe, G. et al., "Algorithms for Iterative Decoding in the Presence of Strong Phase Noise," IEEE Journal on Selected Areas in Communications, vol. 23(9):1748-1757 (Sep. 2005).
Hagenauer, J. et al., "Iterative Decoding of Binary Block and Convolutional Codes," IEEE Transactions on Information Theory, vol. 42(2):429-445 (Mar. 1996).
Howard, S. "Differentially-Encoded Turbo-Coded Modulation with APP Phase and Timing Estimation," A thesis submitted to the Faculty of Graduate Studies and Research in partial fulfillment of the requirements for the degree of Doctor of Philosophy, Department of Electrical and Computer Engineering, University of Alberta, Edmonton, Alberta, 231 pages (Nov. 25, 2006).
Howard, S. et al., "Differential Turbo-Coded Modulation With APP Channel Estimation," IEEE Transactions on Communications, vol. 54(8):1397-1406 (Aug. 2006).
Kschischang, F. et al., "Factor Graphs and the Sum-Product Algorithm," IEEE Transactions on Information Theory, vol. 47(2):22 pages (Feb. 2001).
Kuschnerov, M. et al., "Joint-Polarization Carrier Phase Estimation for XPM-Limited Coherent Polarization-Multiplexed QPSK transmission with OOK-neighbors," ECOC 2008, Brussels, Belgium, IEEE, vol. 1-101, Mo.4.D.2, 2 pages (Sep. 21-25, 2008).
Smith, B. et al., "Future Prospects for FEC in Fiber-Optic Communications," IEEE Journal of Selected Topics in Quantum Electronics, 13 pages (2010).
Taylor, M. et al., "Phase Estimation Methods for Optical Coherent Detection Using Digital Signal Processing," Journal of Lightwave Technology, vol. 27 (7):901-914 (Apr. 1, 2009).
Telecommunication Standardization of ITU, Series G: Transmission Systems and Media, Digital Systems and Networks, Digital sections and digital line system—Optical fibre submarine cable systems, Forward error correction for high bit-rate DWDM submarine systems, ITU-T Recommendation, G.975.1, 58 pages (2004).
Telecommunication Standardization of ITU, Series G: Transmission Systems and Media, Digital Systems and Networks, Digital terminal equipments—General Series Y: Global Information Infrastructure, Internet Protocol Aspects and Next Generation Networks, Internet Protocol Aspects—Transport Interfaces for the Optical Transport Network (OTN) ITU-T Recommendation, G.709/Y.1331, 118 pages (2003).
Ungerboeck, G., "Channel Coding with Multilevel/Phase Signals," IEEE Transactions on Information Theory, vol. IT-28 (1):55-67 (Jan. 1982).
Zhang, H. et al., "Cycle Slip Mitigation in POLMUX-QPSK Modulation," Tyco Electronics Subsea Communications, 250 Industrial Way West, Eatontown, NJ 07724, OMJ7.pdf, OSA/OFC/NFOEC 2010, 3 pages (2010).

\* cited by examiner

| Bits | Transition index |
|------|------------------|
| 000  | 0                |
| 001  | 3                |
| 010  | 5                |
| 011  | 6                |
| 100  | 7                |
| 101  | 4                |
| 110  | 2                |
| 111  | 1                |
Fig. 2
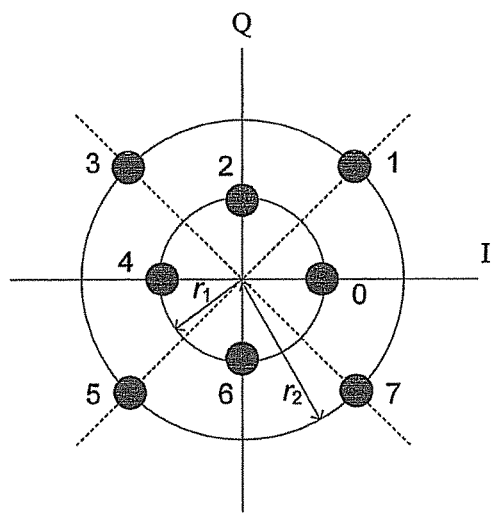
Fig. 3
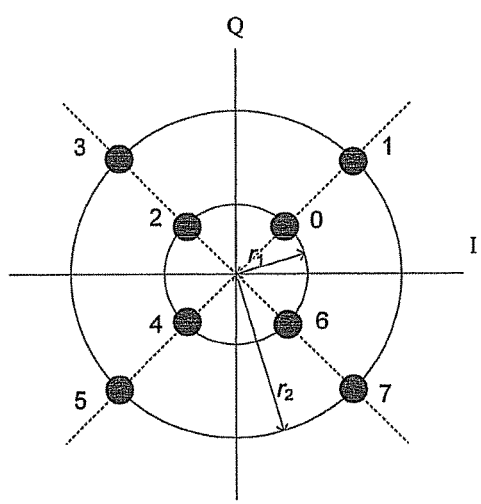
Fig. 4

CYCLE SLIP RESILIENT CODED MODULATION FOR FIBER-OPTIC COMMUNICATIONS

CROSS REFERENCE TO RELATED APPLICATIONS

This application is a 35 U.S.C. 371 national stage filing of International Application No. PCT/EP2015/063933, filed on Jun. 22, 2015, which claims priority to European Patent Application No. 14178516.2 filed on Jul. 25, 2014. The contents of the aforementioned applications are hereby incorporated by reference in their entireties.

FIELD OF THE INVENTION

The present invention relates to the field of channel coding for long-haul and metro fiber-optic communications. In particular, the invention relates to a method for coding and a method for decoding an optical data signal, as well as corresponding coding and encoding devices.

BACKGROUND AND RELATED PRIOR ART

Any modern optical communication system employs channel coding in the form of forward error correction (FEC) to achieve a desired target bit error rate (BER) despite transmission impairments. Systematic FEC schemes insert redundancy, typically properly chosen parity checks, at the transmitter, and exploit this redundancy at the receiver to recover the transmit message. The use of FEC is associated with an increase of the gross data rate and guarantees an extended reach to the receiver or a next 3R regenerator.

Current 100G systems rely upon quaternary phase-shift keying (QPSK) and polarization division multiplexing (PDM) and reserve the parity checks on an overhead of typically between 6.69% and 25%. The baud rate is increased proportionally to the FEC overhead to accommodate the augmented gross data rate in the frequency spectrum.

In a wavelength division multiplexing (WDM) system, several channels are multiplexed in frequency over the same optic fiber at regular frequency spacing. Dense WDM (DWDM) systems are typically based on a 50 GHz grid. Modern networks offer the possibility to route individually each channel at the photonic layer by means of reconfigurable optical add-drop multiplexers (ROADMs), which provide per-channel selection and switching capability. This offers a promising approach to improve the spectral efficiency of a DWDM system by channel bundling. If n 50 GHz filters with 2·n flanks are replaced in each ROADM by a single n·50 GHz filter (with only 2 flanks over the same bandwidth), a net saving of the spectral bandwidth corresponding to 2·(n−1) flanks can be achieved. The resulting n-fold aggregated frequency slot can be used to transmit a bundle of channels that are routed together and are therefore logically regarded as a single super-channel. Whereas for a 50 GHz grid a FEC overhead of about 20% proved to be a reasonable compromise between FEC performance and filter penalty, the opportunity to pack several channels in a super-channel opens up again the question about the optimal gross data rate. Note that for a conventional fixed 50 GHz grid, a reduction of the baud rate and, thus, of the occupied spectrum cannot be exploited directly but rather leads to unused spectrum within each frequency slot. However, in case of channel bundling a lower FEC overhead allows packing more channels together, thus increasing the overall throughput per fiber. Therefore, channel bundling is a strong motivation to reduce the FEC overhead from the customary 20% to e.g. below 10% or even below 7%. Unfortunately, however, with a conventional coding approach, the lower overhead results also in a weaker signal-to-noise ratio (SNR) performance and a significant reach penalty.

Nowadays, most 100G PDM-QPSK commercial systems rely upon so-called differential transmission, meaning that the information is encoded in the phase difference between each symbol and its predecessor. One technology that could promise a significant reach improvement is non-differential transmission, which encodes the information in the absolute phase of the transmit signal. It can be seen that in the presence of strong FEC, the theoretical gain of a non-differential over differential transmission amounts to 1.0-1.5 dB in terms of signal-to-noise ratio (SNR). Unfortunately, however, without a proper reference, the transmit phase is known at the receiver only modulo the rotational symmetry of the signal constellation. For example, in the case of QPSK, the receiver is unable to tell whether the received constellation is in-phase with the transmit constellation or is rotated by a multiple of 90°.

In practice, the phase reference may be provided through the periodic insertion of so-called "pilot tones", i.e. interspersed auxiliary symbols whose absolute phase is known to the receiver. In S. Zhang, X Li, P. Y. Kam, C. Yu and J Chen, "*Pilot-assisted decision-aided maximum-likelihood phase estimation in coherent optical phase-modulated systems with nonlinear phase noise,*" IEEE Photonics Technology Letters, vol. 22, no. 6, pp. 380-382, March 2010, pilot-assisted decision-aided maximum-likelihood phase estimation is introduced. In H. Zhang, Y. Cai, D. G. Foursa, and A. N. Pilipetskii, "*Cycle slip mitigation in POLMUXQPSK modulation,*" in Optical Fiber Communication Conference and Exposition and the National Fiber Optic Engineers Conference (OFC/NFOEC) 2011, Paper OMJ7, March 2011, the phase recovered from the pilot symbols is combined with the outcome of a standard M-th power algorithm to produce a pilot-assisted M-th power phase estimate. In M A. Castrillon, D. A. Morero and M. R. Hueda, "*A new cycle slip compensation technique for ultra high speed coherent optical communications,*" in IEEE Photonics Conference (IPC) 2012, pp. 175-176, September 2012, a pilot-assisted cycle slip detector and corrector processes the output of a conventional M-th power phase estimate. All these prior art solutions employ pilot symbols to improve the carrier phase recovery, but unfortunately, at the expense of the spectral efficiency and the rate loss due to a baud rate increase. Namely, since the optical channel is affected by a strong phase noise, the receiver must always track the carrier phase also between the pilot symbols, with a risk of generating an unwanted abrupt phase jump congruent with the rotational symmetry of the constellation. This jump, known as "cycle slip", can be corrected only with the help of the next pilot tone and, consequently, produces an error burst whose length depends on the pilot symbol spacing. Obviously, frequent pilot symbols reduce the impact of cycle slips, but at the same time adversely affect the spectral efficiency and the baud rate of the system. So in summary, the achievable performance is constrained by the trade-off between resilience to cycle slips and pilot overhead.

One idea to diminish the baud rate without weakening the SNR performance is introduced in G. Ungerboeck, "*Channel coding with multilevel/phase signals,*" IEEE Trans. Inform. Theory, vol. IT-28, pp. 55-67, January 1982. In this work, it is suggested to allocate the FEC redundancy in the signal space rather than in the frequency spectrum: by using a larger constellation than what is strictly necessary to support the desired bit rate, one provides room for additional FEC redundancy and, possibly, even potential for reducing the baud rate and shrinking the occupied bandwidth. This approach is referred to in the following as "constellation expansion". While Ungerboeck only suggested constellation expansion for the electrical domain, its application to fiber-optic communications has been fostered in B. P. Smith and F. R. Kschischang, "Future prospects for FEC in Fiber-Optic communications," IEEE Journal Select. Topics Quantum Electr., vol. 16, no. 5, September 2010, but has not yet found its way into commercial systems.

A particular application of the "constellation expansion" concept is described in S. L. Howard and C. Schlegel, "Differential turbo-coded modulation with APP channel estimation," IEEE Trans. Comm., vol. 54, no. 8, August 2006; and in S. Howard, "Differentially-encoded turbo-coded modulation with APP phase and timing estimation," Ph.D. thesis, University of Alberta, Canada, November 2006. In this work, it is shown that a concatenation of a single parity check (SPC) code with a differential 8-ary phase-shift keying (8PSK) modulation may outperform even large 8PSK trellis codes as suggested by Ungerboeck by 1 dB. The simplicity of the SPC code makes this solution attractive also for optical communications, where the extremely high data rate sets a limit to the complexity of viable algorithms. Howard and Schlegel propose a combination of decoder and carrier recovery according to an iterative expectation-maximization (EM) algorithm: at every iteration an expectation step calculates a soft-decision phase reference on the basis of the current decoding result, and a maximization step uses this phase reference to compute the channel metrics for the next decoder run. Unfortunately, however, the resulting carrier recovery fails to fulfil the requirements posed by the rough fiber-optic communication channel.

A first problem encountered is the existence of meta-stable states: For specific critical channel phases, the acquisition algorithm can hang indefinitely in an invalid state even if a very large number of decoding iterations is performed. This situation results, of course, in a dramatic degradation of the BER. Further, although the carrier recovery does not entail an M-th power computation, the expectation-maximization algorithm can generate cycle slips due to the rotational invariance of the differential 8PSK modulation. At each cycle slip bit errors occur, which, depending on their distribution with respect to the SPC code, are corrected or persist during the subsequent decoding process. The cycle slips are also the reason of a limited tolerance of this scheme to frequency offset. A frequency offset produces continuous cycle slips that overload the decoder.

Finally, the expectation-maximization algorithm employed by Howard and Schlegel is not sufficiently robust against phase noise. Laser oscillators have Lorentzian lineshape, which gives rise to a Wiener phase noise process, i.e. a Gaussian phase random walk (see e.g. M. G. Taylor, "Phase estimation methods for optical coherent detection using digital signal processing," IEEE Journal Lightwave Technology, vol. 22, no. 7, April 2009). With the current technology, the linewidth of the transmit laser and the local oscillator laser at the receiver may lie between 100 kHz and 1 MHz. For a PDM-QPSK 100G system and a realistic combined laser linewidth in the range of 200 kHz to 2 MHz, the standard deviation of the phase steps generated by laser phase noise ranges from 0.38 to 1.2 degrees per symbol interval. Nonlinear effects along the fiber may further increase the phase noise. In section 9.6.2 of the above-cited PhD-thesis of S. Howard, results in the presence of a random walk phase process are presented. It is seen that with a standard deviation of only 0.22 degrees per symbol interval, a penalty as high as 0.25-0.5 dB is observed along the so-called "turbo cliff".

In the literature, more advanced techniques for joint carrier recovery and decoding have been proposed. An overview is given in G. Colavolpe and G. Caire, "Iterative joint detection and decoding for communications under random time-varying carrier phase," Tech. Rep., ESA Contract 17337/03/NL/LvH, March 2004, which shows the superiority of the Bayesian approach over expectation-maximization algorithms. The algorithms described in G. Colavolpe, A. Barbieri, and G. Caire, "Algorithms for iterative decoding in the presence of strong phase noise," IEEE J Sel. Areas Commun., vol. 23, no. 9, pp. 1748-1757, September 2005 for non-differential transmission, and in A. Barbieri and G. Colavolpe, "Soft-output detection of differentially encoded M-PSK over channels with phase noise," EUSIPCO 2006, Florence, Italy, September 2006 for differential transmission achieve almost optimal performance also in the presence of very strong phase noise and, at the same time, are simpler than most alternative solutions. Unfortunately, however, their complexity remains too high for an implementation at optical data rates.

SUMMARY OF THE INVENTION

The problem underlying the invention is to provide a coding and decoding method and apparatus that overcomes the deficiencies indicated in the prior art as summarized above. This problem is solved by a method of decoding an optical data signal according to claim 1 and a method for encoding an optical data signal according to claim 17 as well as by a receiver and a transmitter employing such decoding and encoding methods.

According to the invention, the optical data signal is phase- and amplitude-modulated according to a constellation diagram with at least eight constellation points representing non-binary symbols. The method comprises the following steps:

carrying out a phase recovery of a received signal ignoring the possible occurrence of phase slips, and decoding said signal after phase recovery, wherein in said decoding, possible cycle slips occurring during phase recovery are modelled as virtual input to an equivalent encoder assumed by the decoding scheme.

According to the invention, the phase recovery of the received signal is carried out while ignoring, and in particular without correcting phase slips in the received signal that may have occurred during phase recovery. So unlike the teaching of Howard and Schlegel, Colavolpe, Caire and Barbieri in the above-referenced prior art, in the present invention, the carrier recovery and the decoding are not combined. Instead, the method of the invention uses a separate carrier phase recovery implemented before the decoder, and the invention makes use of a concatenated non-binary code that is resilient to the phase cycle slips that can arise in such a carrier recovery. According to the invention, this is achieved by modelling, in the decoding, possible cycle slips occurring during phase recovery as a virtual input to an "equivalent encoder" assumed by the decoding scheme. In other words, the decoding scheme of the invention does not match the true encoding scheme actually employed by the transmitter, but rather matches an "equivalent encoder" which is modelled such as to receive the cycle slips as imagined or virtual input. This virtual input is also referred to as an "equivalent phase slip" in the present disclosure. If no true cycle slip occurs during the phase recovery, the proper decoding will determine that the "equivalent phase slip" inputted to the equivalent encoder was zero. Moreover, any true cycle slip actually occurring during phase recovery will be determined as a non-zero "equivalent phase slip" input to the virtual encoder upon decoding.

Further according to the invention, the constellation diagram has at least eight constellation points representing non-binary symbols. This corresponds to the concept of "constellation expansion" described in the introductory portion of the specification and will become more apparent below with reference to specific examples.

Preferably, the constellation diagram exhibits a $\pi/2$ rotational symmetry in the complex plane, in spite of the fact that it includes eight or more constellation points. In particular, the constellation diagram may be an 8QAM or a 2-amplitude 4-phase shift keying constellation. The advantage of employing a $\pi/2$ rotational symmetry is that only three possible kinds of phase slips may occur. Since each possible phase slip corresponds to a different virtual input to the equivalent encoder that needs to be determined upon decoding, limiting the number of possible phase slips reduces the decoding effort and helps to avoid decoding errors. This is different from the coded modulation of Howard and Schlegel, where an 8PSK constellation has been used which includes a $\pi/4$ rotational symmetry and hence gives rise to seven possible phase slips.

In a preferred embodiment, the decoding step comprises an iterative procedure involving a first soft decoder operating according to a first coding scheme on said non-binary symbols or on labels representing the same, and a second soft decoder operating according to a second coding scheme. Herein, the first and second soft decoders receive probabilistic a priori input information and output probabilistic a posteriori information, wherein within an iteration an a priori input of the second soft decoder is based at least in part on an a posteriori output of the first soft decoder, and an a priori input of the first soft decoder is based at least in part on an a posteriori output of the second soft decoder. Each iteration has the capability of improving the decoding performance until convergence to an estimated information sequence occurs. Note that defining the a priori input of the second (first) soft decoder to be "based" at least in part on a posteriori output of the first (second) soft decoder includes the important case where the second (first) soft decoder receives an extrinsic or "extrinsicated" a posteriori output, in which only the difference or "information gain" between the a posteriori and the a priori information is reflected, as will become more apparent from specific examples below. In other words, whenever in the following description reference is made to an a posteriori output inputted into another component, this shall always be understood to also include the corresponding "extrinsicated" a posteriori output, without further mention.

Preferably, the a priori input to the first soft decoder further comprises an input related to the probability of cycle slips to occur.

Preferably, the first equivalent coding scheme is a differential coding scheme operating on said non-binary symbols or associated labels, where the encoding result of each symbol depends both on the symbol itself and on the previous symbol. In particular, the first equivalent encoder may be an equivalent accumulator, i.e. an accumulator which differently from the "true accumulator" employed by a corresponding transmitter receives a virtual cycle slip input to thereby model possible cycle slips as equivalent or virtual input.

In a preferred embodiment, the first equivalent coding scheme employs, in addition to the non-binary symbols to be encoded, an equivalent phase slip input representing a corresponding phase slip angle. Herein, the first equivalent coding scheme on which the first soft decoder operates is such that for each symbol
  the encoding result of a symbol with a given equivalent phase slip input, and
  the encoding result of the same symbol encoded with zero equivalent phase slip input but subjected to a true phase slip of said phase slip angle
is identical. Herein, the "equivalent phase slip input" is an example of the "virtual input" referred to above. As long as the equivalent encoder which is assumed by the decoding scheme receives a zero equivalent phase slip input, its encoding result is the same as that of the "true first encoder" employed by the transmitter of the signal. However, if the equivalent encoder receives a certain non-zero equivalent phase slip input, the encoding result will differ by the corresponding phase slip angle. This way, possible cycle slips occurring during phase recovery are in fact modelled as virtual input to an equivalent encoder which is assumed by the first soft decoder.

In a preferred embodiment, the constellation diagram comprises 4n constellation points consisting of n groups of four constellation points having identical amplitude and phase differences of multiples of $\pi/2$. Further, the constellation points are labelled by integer numbers $\{0, 1 \ldots, 4n-1\}$, wherein the labels are chosen such that for each two labels i, j corresponding to constellation points of a same group, where the phase of the constellation point i differs from that of constellation point j by $\pi/2$, the following relation applies: $j=i+n \text{ MOD}(4n)$, and wherein said first soft decoder operates on said labels. This particular labelling allows for a very simple way of introducing equivalent phase slips in the first equivalent coding scheme. Namely, for any constellation point labelled by a label i, the label of a constellation point differing by a phase slip of $\pi/2$ can simply be obtained by increasing the integer number i by n. Likewise, the label of the constellation point differing from the constellation point i by a phase slip of $\pi$ or of $3/2\pi$ can be obtained by increasing the integer number i by 2n and 3n, respectively, where the result of this calculation is always truncated to a number smaller than 4n by the modulo function. Clearly, for the arithmetics it is immaterial whether the phase slips are positive or negative, as long as they are used consistently. In other words, the above equation $j=i+n \text{ MOD}(4n)$ could apply for any constellation points labelled i and j where the phase of constellation point j in relation to the phase of constellation point i is shifted by $\pi/2$. In a different embodiment, this equation could be valid for all constellation points labelled i, j, where the phase of the constellation point labelled j in relation to the phase of constellation point i is shifted by $-\pi/2$.

Preferably, the first soft decoder employs a Maximum A Priori (MAP) symbol-by-symbol decoding, and preferably a BCJR algorithm. The BCJR algorithm is named after its inventors Bahl, Cocke, Jelinek and Raviv, and shall not be explained in detail in this disclosure. Instead, reference is made to the seminal article L. R. Bahl, J Cocke, F. Jelinek, and J. Raviv, "*Optimal decoding of linear codes for minimizing symbol error rate,*" *IEEE Trans. Inform. Theory*, March 1974. Since the first soft decoder operates on a first equivalent coding scheme which employs not only the non-binary symbols, but also the equivalent phase slips as input, carrying out the demodulation would appear to be computationally quite demanding. However, particularly using the powerful BCJR decoding, the decoding can be carried out at sufficient speed even for high symbol rates. It is particularly advantageous to use a version of the BCJR algorithm that employs a fully parallel flooding scheduling on an equivalent factor graph, as is described in detail in F. R. Kschischang, B. J. Frey, and H.-A. Loeliger, *"Factor graphs and the sum product algorithm,"* IEEE Trans. on Inform. Theory, Febr. 2001.

Since the equivalent cycle slips are treated as virtual input to the first equivalent coding scheme, the estimates of cycle slips are part of the decoding results of the first soft decoder. In a preferred embodiment, the first soft decoder hence outputs a posteriori probabilities for equivalent cycle slips, and the probabilities of particular cycle slips to occur are determined based on statistics of said outputted a posteriori probabilities of equivalent cycle slips. This way, realistic estimates of the probabilities of cycle slips to occur can be obtained and maintained during operation, and then be used as a priori input to the first soft encoder.

In a preferred embodiment, the second coding scheme is a binary error control coding scheme, and in particular a $\frac{2}{3}$ single parity check coding scheme. The $\frac{2}{3}$ single parity check coding scheme is particularly attractive if the non-binary symbols are represented by eight constellation points. This way, every non-binary symbol can be mapped on a 3-bit word, of which every third bit is used for the single parity check. This is an example of the aforementioned general concept of "constellation expansion", where the signal space (in this example eight symbols) uses a larger constellation than strictly necessary for supporting a desired bit rate. Namely, while a constellation diagram with only four constellation points would be sufficient to encode 2-bit-words, using eight constellation points leaves room for adding a parity bit that can be used in the $\frac{2}{3}$ single parity check coding scheme.

Preferably, the information exchanged between the first and second soft decoders is interleaved and de-interleaved, respectively. This way, correlations can be suppressed.

The decoding procedure preferably further employs a mapping between said non-binary symbols and a bit sequence, wherein the mapping is chosen such that of any two symbols of identical amplitude and phase difference of π/2, the corresponding bit sequence differs in at least two bit positions and/or an average by more than half the bit positions. The rationale behind this is that two symbols that differ only by a smallest possible phase slip of π/2 will lead to bit sequences with a large Hamming distance, which in a sense could be regarded as an "anti-Gray" mapping. A small phase slip will hence lead to a comparatively large error in the bit sequence, or in other words, each cycle slip produces a maximum number of violations in the SPC code. While this may look counter-intuitive at first sight, it actually helps the iterative process to reliably localize the violations due to the cycle slip and to correct it.

In a preferred embodiment, the decoding is carried out simultaneously for two different polarizations of the data signal, in particular two orthogonal polarizations. In this case, the method employs two of said first soft decoders, each of them receiving probabilistic information about non-binary symbols transmitted in a respective one of said polarizations. The a posteriori outputs of the two first soft decoders, or data derived therefrom, are preferably combined prior to being inputted to the second soft decoder, and the a posteriori output of the second soft decoder, or data derived therefrom, is split into two portions for input into a respective one of said first soft decoders. Herein, reference to the "data derived therefrom" is made to include the possibility that some further operations are made on the data, for example extrinsication, de-mapping, mapping, interleaving and de-interleaving.

In a preferred embodiment, the aforementioned decoding is an inner decoding, which is followed by an outer decoding according to an outer coding scheme providing for forward error correction with an overhead of less than 15%, preferably less than 10%, and most preferably less than 7%. This overhead of the outer coding/decoding can be regarded as the effective overhead, because the overhead in the inner code is effectively absorbed in the constellation expansion employing at least eight constellation points representing non-binary symbols, and this "effective overhead", which results into a proportional increase of the baud rate, can be made as small as 7% or below, e.g. 6.69% if a standard Reed-Solomon code is employed for the outer code according to the ITU-T recommendation G.709 Annex A.

The present invention also relates to a method for encoding an optical data signal by phase and amplitude modulation according to a constellation diagram with at least eight constellation points representing non-binary symbols and exhibiting a π/2 rotational symmetry in the complex plane, and in particular according to an 8QAM or a 2-amplitude 4-phase shift keying constellation said method comprising the following steps:

encoding binary data according to a second coding scheme, mapping the encoded binary data to said non-binary symbols, wherein a bit sequence is mapped to a non-binary symbol and the mapping is chosen such that for any two symbols of identical amplitude and a phase difference of π/2, the corresponding bit sequence differs in at least two bit positions and/or on average by more than half of the bit positions, encoding the non-binary symbols, or labels representing the same, using a first coding scheme, and modulating an optical carrier according to the encoded non-binary symbols.

Preferably, the first coding scheme is a differential coding scheme operating on said non-binary symbols or labels representing the same. Alternatively or in addition, the second encoding scheme may be a binary error control coding scheme, in particular $\frac{2}{3}$ single parity check coding scheme.

Preferably, the encoded binary data is interleaved prior to mapping the same to said non-binary symbols.

In a preferred embodiment, the encoded binary data is split into two portions, wherein each portion is mapped to non-binary symbols, encoded according to the first coding scheme and used for modulating one polarization of an optical carrier.

In a preferred embodiment, the method further comprises a step of encoding input data according to an outer coding scheme providing for forward error correction with an overhead of less than 15%, preferably less than 10%, and most preferably less than 7%, wherein the coding result of the outer encoding is used as a binary data input for said encoding according to the second coding scheme.

SHORT DESCRIPTION OF THE FIGURES

FIG. 1 is a block diagram of a transmitter comprising an outer and an inner encoder, FIG. 2 is a table summarizing the mapping between bit sequences and transition indices or labels representing non-binary symbols, FIG. 3 is a constellation diagram of an 8QAM constellation, FIG. 4 is a constellation diagram of a two-amplitude four-phase phase shift keying constellation, FIG. 5 is a block diagram of an accumulator employed by the inner encoder of the transmitter of FIG. 1, FIG. 6 is a block diagram of a receiver employing an inner decoder and an outer decoder, FIG. 7 is a block diagram showing the details of the inner decoder of the receiver of FIG. 6, FIG. 8 is a block diagram of an equivalent accumulator employed by the inner decoder of FIG. 7, FIG. 9 shows simulation results of bit error rate versus signal-to-noise ratio for the inner code on the 8QAM constellation in absence of cycle slips, FIG. 10 shows simulation results of bit error rate versus signal-to-noise ratio for the inner code on the two-amplitude four-phase phase shift keying constellation in absence of cycle slips, FIG. 11 shows simulation results of bit error rate versus signal-to-noise ratio for the inner code on the 8QAM constellation in presence of cycle slips, FIG. 12 shows simulation results of bit error rate versus signal-to-noise ratio for the inner code on the two-amplitude four-phase phase shift keying constellation in presence of cycle slips.

DESCRIPTION OF THE PREFERRED EMBODIMENT

For the purposes of promoting an understanding of the principles of the invention, reference will now be made to the preferred embodiments illustrated in the drawings and specific language will be used to describe the same. It will nevertheless be understood that no limitation of the scope of the invention is thereby intended, such alterations and further modifications in the illustrated device and method and such further applications of the principles of the invention as illustrated therein being contemplated therein as would normally occur now or in the future to one skilled in the art to which the invention relates.

FIG. 1 is a schematic block diagram of a transmitter 10 employing an encoding scheme according to one embodiment of the present invention. The transmitter 10 of FIG. 1 comprises an outer encoder 12 and an inner encoder 14. The outer encoder 12 receives digital data b and encodes the same according to an outer coding scheme having a small overhead of less than 10%. In particular, the outer encoder 12 may employ a Reed-Solomon code as recommended in *ITU-T Recommendation G. 709, "Interfaces for the Optical Transport Network (OTN)"*, February 2012, Annex A having an overhead of only 6.69%. Alternatively, other codes described in *ITU-T Recommendation G.975.1, "Forward error correction for high bit-rate DWDM submarine systems"*, February 2004, Appendix I have a similar overhead of only 6.69% and can likewise be employed.

The output bits of the outer encoder 12, represented by c in FIG. 1, are interleaved by an interleaver #1 shown at reference sign 16 to yield an interleaved bit stream represented by c', which is inputted into the inner encoder 14.

At the entrance of the inner encoder 14, the bit sequence c' is SPC-encoded by an SPC encoder 18 employing a ⅔ single parity check forward error correction scheme. The SPC encoder 18 appends to each pair of input bits a single check bit computed as the exclusive OR of the two input bits.

Groups of 6·n (with n a positive integer) SPC-encoded bits are formed and forwarded to a subsequent interleaver #2 shown at reference sign 20, which like the interleaver #1 provides for a bit permutation.

The output d' of the interleaver #2 20 is divided by a splitter 22 into two blocks of 3·n bits that are individually encoded differentially by differential decoders 24 and eventually transmitted over two orthogonal polarizations x and y.

As is further seen in FIG. 1, each differential encoder 24 comprises a mapper 26 for mapping bits to transition indices. More precisely, each group of three subsequent input bits is mapped to a single transition index according to the transition table in FIG. 2, such that the entire block of 3·n bits is mapped to a sequence of n transition indices. The transition indices are an example of the aforementioned labels for labelling constellation points of a constellation diagram representing non-binary symbols.

FIG. 3 shows a constellation diagram for an 8QAM constellation that can be employed in the present invention. Next to each constellation point in the 8QAM diagram, the transition index or label is shown.

FIG. 4 shows an alternative constellation diagram with likewise 8 constellation points representing non-binary symbols, which in case of FIG. 4 is represented by a 2-amplitude 4-phase shift keying constellation, where again the transition indices or labels are shown.

Figure 5:
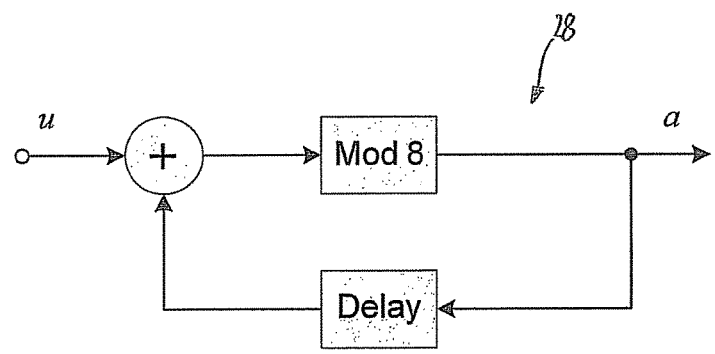

The transition indices $u_x$ and $u_y$ of the two mappers 26 of the two differential encoders 24 are each inputted into a corresponding accumulator 28 shown in FIG. 5. The outputs $a_x$ and $a_y$ of accumulators 28 are inputted to a mapper 30 which maps the output of the accumulator 28, which is a label ranging again from {0, 1 . . . 7}, to a symbol or constellation point according to the scheme summarized in FIG. 3 or FIG. 4. According to the present disclosure, both the transition indices $u_x$ and $u_y$ and the labels $a_x$, $a_y$ are regarded as "labels representing non-binary symbols". However, for clarity reasons, the labels inputted to the accumulator 28 are specifically referred to as "transition indices" while the labels outputted by the accumulator 28 may be referred to specifically as "addresses" of a symbol, namely of a symbol that is actually transmitted over the optical fiber. This distinction in terminology is only used to refer to the function of the respective labels in the coding and decoding scheme, but no limitation is thereby intended.

Figure 6:
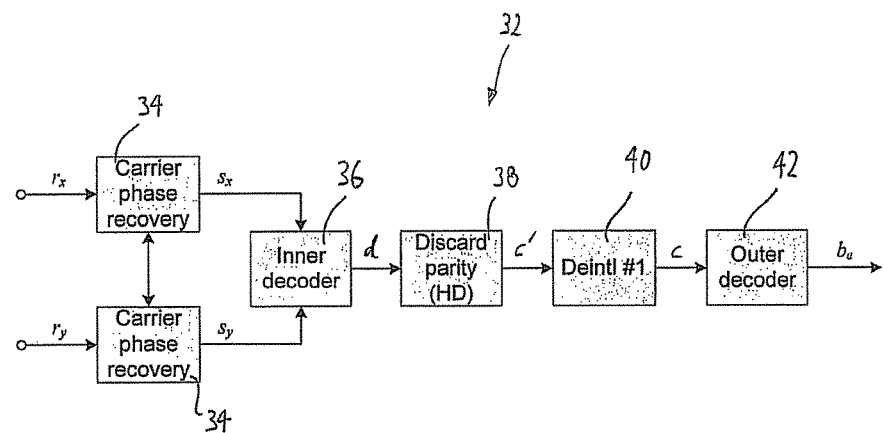

In FIG. 6, an overview of a receiver 32 according to an embodiment of the present invention is shown. The complex baseband signals may be represented with one sample per symbol. In FIG. 6, it is assumed that the usual demodulation steps and in particular the polarization discrimination has been applied already. As shown in FIG. 6, the receiver 32 has two carrier phase recovery units 34 for carrying out the phase recovery. The phase recovery can be carried out in a manner per se known from prior art such as from M G. Taylor, *"Phase estimation methods for optical coherent detection using digital signal processing" IEEE Journal Lightwave Technology*, vol. 22, no. 7, April 2009. Alternatively, the phase recovery can also be carried out prior to splitting the two polarizations in a manner described for example in M Kuschnerov, D. van den Borne, K Piyawanno, F. N. Hauske, C. R. S. Fludger, T. Duthel, T. Wuth, J. C. Geyer, C. Schulien, B. Spinnler, E.-D. Schmidt, B. Lankl, *"Joint-Polarization Carrier Phase Estimation for XPM-Limited Coherent Polarization-Multiplexed QPSK transmis-* sion with OOK-neighbors," ECOC 2008, Mo.4D.2, Brussels, Belgium, 21-25 Sep. 2008.

The resulting samples are passed to an inner decoder 36 according to an embodiment of the present invention, which will be described in more detail with reference to FIG. 7.

The inner decoder 36 outputs a posteriori probabilities for bits d. Taking advantage of the systematic nature of the SPC, the following block 38 discards the parity bits and delivers a posteriori probabilities or tentative decisions for the interleaved bits c', depending on whether an adjacent outer decoder 42 accepts soft or hard decisions, respectively. The interleaved bits c' are de-interleaved with a de-interleaver #1 40 which is the inverse of the interleaver #1 16 of the transmitter 10 of FIG. 1. The aforementioned outer decoder 42 receives the de-interleaved stream and produces an estimate of the payload bits achieving a desired BER.

Figure 7:
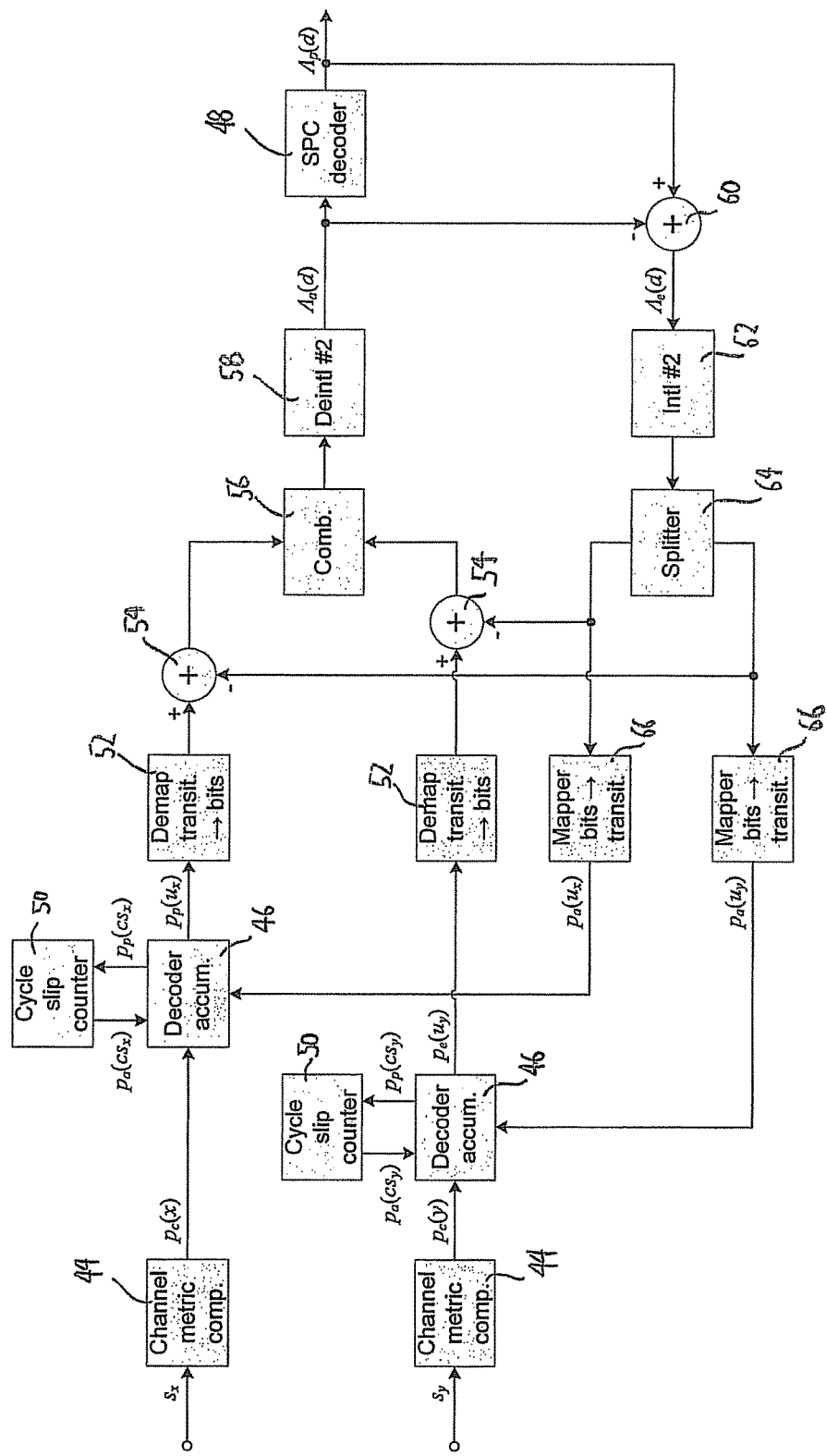

In FIG. 7, the inner decoder 36 of the receiver 32 of FIG. 6 is shown in greater detail. As is shown in FIG. 7, the two complex input streams $s_x$, $s_y$ are forwarded to the corresponding channel metric computers 44, which deliver under the Additive White Gaussian Noise (AWGN) assumption for each input sample s the eight probabilities $$p_c(s, i) = \frac{1}{\sqrt{\pi N_0}} \exp\left(-\frac{|s - a_i|^2}{N_0}\right) \quad (i = 0, 1, \ldots, 7). \quad (1)$$

Herein, each probability $p_c(s,i)$ can be regarded as the probability that the signal corresponds to the state $a_i$, where $a_0, a_1, \ldots, a_7$ are the eight complex symbols of the signal constellation shown in FIG. 3 or 4, respectively.

The resulting streams of channel probabilities, i.e. eight probabilities per symbol interval and polarization, are the input to the subsequent iterative decoder, which consists of all the remaining blocks of the inner decoder 36 shown in FIG. 7. In FIG. 7, the iterations are implemented in a loop structure. In practice, however, they can be also rolled out in a pipeline structure or embodied in any functionally equivalent architecture. The iterative decoder works on a block of n symbols per polarization (or 6·n bits altogether), as determined by the size of the second interleaver #2 20.

Figure 8:
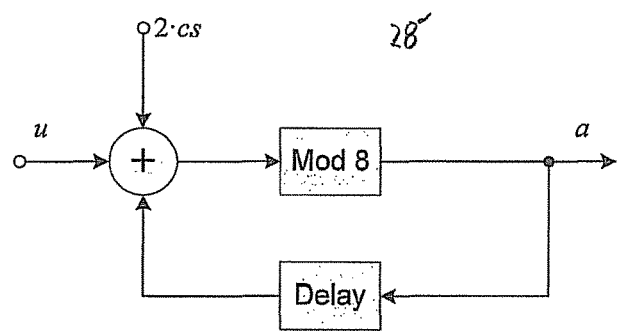

The inner decoder 36 comprises two accumulator decoders 46 resembling first soft decoders and an SPC-decoder 48 resembling a second soft decoder. The two accumulator decoders 46 are intended to provide cycle slips resilience. Importantly, the accumulator decoders 46 are not decoders matching the "true" accumulators 28 as shown in FIG. 5. Instead, the accumulator decoders 46 are designed as decoders for an equivalent accumulator 28' shown in FIG. 8. As is seen by comparison of FIGS. 5 and 8, the "equivalent accumulator" 28' differs from the "true accumulator" 28, i.e. the accumulator 28 that is actually used in the transmitter, in that it receives a further input that is herein referred to as "equivalent phase slip input" representing a corresponding slip angle. Herein, cs can be an integer number of 0, 1, 2 and 3, corresponding to an equivalent phase slip of 0 (i.e. no phase slip), $\pi/2$, $\pi$ and $3/2\pi$.

As can be seen from the way the labels are assigned to the symbols or constellation points in FIGS. 3 and 4, adding the integer 2 to each label leads to a symbol having a phase increased by $\pi/2$. In other words, adding the integer 2 (i.e. cs=1) in the equivalent accumulator 28' of FIG. 7 introduces an artificial phase slip by $\pi/2$, adding an integer 4 (corresponding to cs=2) leads to an artificial phase slip of $\pi$ and adding an integer number 6 (corresponding to es=3) corresponds to adding a phase slip of $3/2\pi$. While the true cycle slips originate at the receiver 32 within the phase recovery carried out by the phase recovery units 34, according to the present invention they are modelled as a virtual input to the "equivalent accumulator" 28' which is "assumed" by the decoding scheme. This is an example of the general concept described in the introductory portion according to which possible cycle slips occurring during phase recovery are modelled as virtual input to an equivalent encoder assumed by the decoding scheme. Herein, the expression "assumed by the decoding scheme" is another way of saying that the actual decoders do not match the actual encoders at the corresponding transmitters, but an equivalent encoder that is "assumed" to be present at the transmitter and allows for modelling cycle slips as an equivalent input.

Since the equivalent accumulator 28' can be regarded as a (unitary rate) non-binary recursive convolutional code, optimal Maximum A Posteriori (MAP) symbol-by-symbol decoding can be achieved with the classic BCJR algorithm described in L. R. Bahl, J. Cocke, F. Jelinek, and J Raviv, "*Optimal decoding of linear codes for minimizing symbol error rate,*" *IEEE Trans. Inform. Theory*, March 1974. To enable high-speed implementation, the standard scheduling of the BCJR algorithm based on a forward and a backward iteration can be replaced by a fully parallel flooding scheduling on an equivalent factor graph. The representation of a BCJR algorithm on a factor graph is for example described in F. R. Kschischang, B. J. Frey, and H-A. Loeliger, "*Factor graphs and the sum-product algorithm,*" *IEEE Trans. on Inform. Theory*, Febr. 2001.

Referring again to FIG. 7, inputs to each accumulator decoder 46 are the channel probabilities and the a priori probabilities for the transition indices and cycle slips. During the first iteration, the a priori probabilities for all eight transitions $u_x$ and $u_y$ at each symbol interval are uniform. At the subsequent iterations, the a priori transition probabilities are obtained from the outcome of the SPC decoding provided by the SPC-decoder 48, which, as mentioned before, represents an example of a second soft decoder, operating according to a second coding scheme.

The a priori cycle slip probabilities are assumed to be independent of the symbol interval and are not necessarily updated along the iterations. They can be initialized according to the expected performance of the carrier phase recovery and thereafter slowly be adapted on the basis of the cycle slip rate measured by a cycle slip counter indicated at reference sign 50 in FIG. 7.

Each accumulator decoder 48 returns the a posteriori transition probabilities $p_p(u)$ and cycle slip probabilities $p_p(cs)$. The a posteriori transition probabilities $p_p(u)$ are passed to a transition-to-bits soft demapper 52. The cycle slip probabilities $p_p(cs)$ are passed to the cycle slip counter 50 to measure the cycle slip rate.

For each polarization, the soft demapper 52 computes the Log-Likelihood Ratios (LLRs) for the SPC-encoded bits by inverting the mapping of FIG. 2. Starting from the leftmost bit the LLRs are $$\Lambda_2 = \ln \frac{p_p(0) + p_p(3) + p_p(5) + P_p(6)}{p_p(1) + p_p(2) + p_p(4) + p_p(7)}, \quad (2)$$

$$\Lambda_1 = \ln \frac{p_p(0) + p_e(3) + p_p(4) + P_p(7)}{p_p(1) + p_p(2) + p_p(5) + p_p(6)} \quad (3)$$

and $$\Lambda_0 = \ln \frac{p_p(0) + p_p(2) + p_p(5) + P_p(7)}{p_p(1) + p_p(3) + p_p(4) + p_p(6)}. \quad (4)$$

Subsequently, each a posteriori LLR is decremented by the corresponding a priori LLR to yield the so-called "extrinsic" LLRs, as is common in the theory of soft iterative decoding, see e.g. F. R. Kschischang, B. J Frey, and H-A. Loeliger, "*Factor graphs and the sum-product algorithm,*" *IEEE Trans. on Inform. Theory*, Febr. 2001. The "extrinsication" is achieved by the adders 54, which effectively operate as subtractors.

Figure 1:
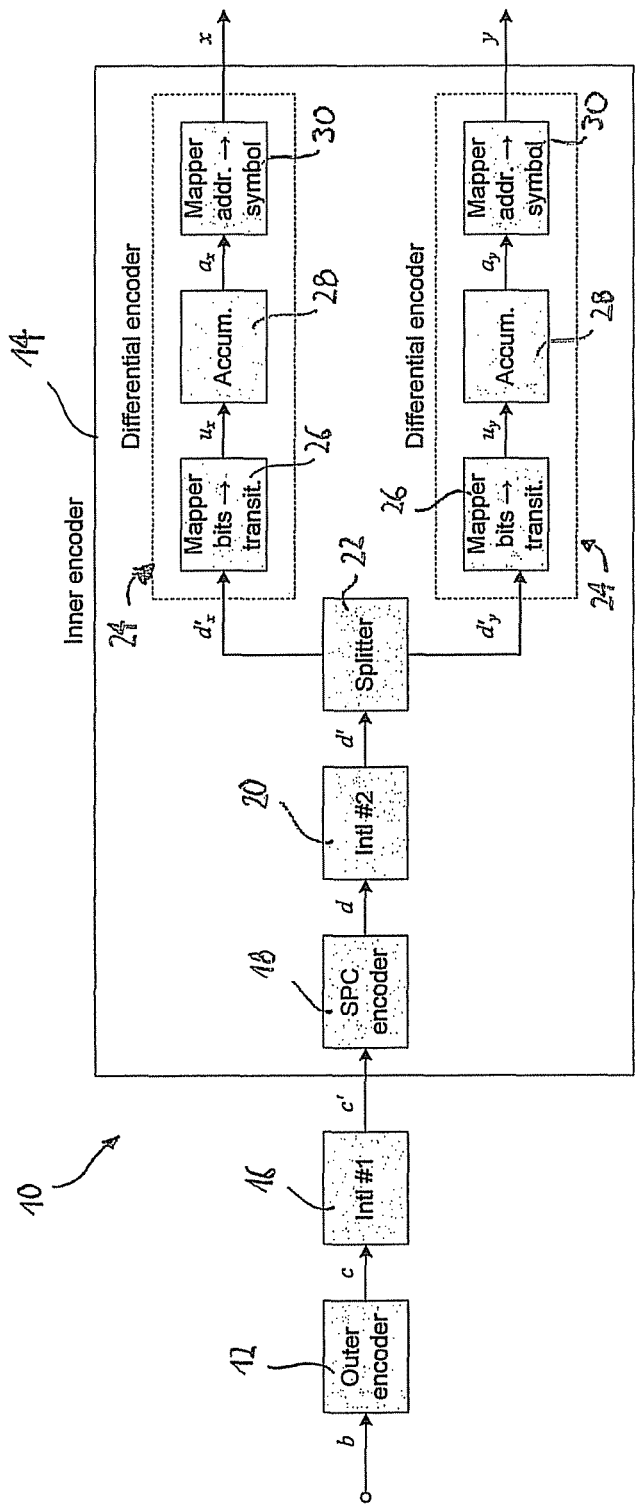

The streams of extrinsic LLRs corresponding to the two polarizations are combined in a combiner block 56 that implements the inverse function of the splitter block 22 in the transmitter 10 of FIG. 1. The resulting sequence of 6·n LLRs is de-interleaved by de-interleaver #2 58, which implements the inverse permutation of interleaver #2 20 in the transmitter 10 of FIG. 1.

The resulting de-interleaved sequence of 6·n LLRs serves as a priori information for the SPC decoder 48. For any SPC codeword consisting of three bits $d_k$, $d_{k+1}$ and $d_{k+2}$, under the usual assumption of statistical independence of the a priori LLRs, MAP decoding can be implemented as $$\Lambda_p(d_k) = \Lambda_a(d_k) + \ln\frac{1 + \exp(\Lambda_a(d_{k+1})) \cdot \exp(\Lambda_a(d_{k+2}))}{\exp(\Lambda_a(d_{k+1})) + \exp(\Lambda_a(d_{k+2}))}, \quad (5)$$

$$\Lambda_p(d_{k+1}) = \Lambda_a(d_{k+1}) + \ln\frac{1 + \exp(\Lambda_a(d_k)) \cdot \exp(\Lambda_a(d_{k+2}))}{\exp(\Lambda_a(d_k)) + \exp(\Lambda_a(d_{k+2}))} \quad (6)$$

and $$\Lambda_p(d_{k+2}) = \Lambda_a(d_{k+2}) + \ln\frac{1 + \exp(\Lambda_a(d_k)) \cdot \exp(\Lambda_a(d_{k+1}))}{\exp(\Lambda_a(d_k)) + \exp(\Lambda_a(d_{k+1}))}, \quad (7)$$

see J. Hagenauer, E. Offer, and L. Papke, "*Iterative decoding of binary block and convolutional codes,*" *IEEE Trans. on Inform. Theory*, March 1996, section II.A.

If desired, the second term in the previous three equations (5) to (6) can be simplified as desired. In the simplest case, it can be approximated as follows:

$$\ln\frac{1 + \exp(x) \cdot \exp(y)}{\exp(x) + \exp(y)} \approx \mathrm{sign}(x) \cdot \mathrm{sign}(y) \cdot \min[|x|, |y|]. \quad (8)$$

At the last iteration, the a posteriori LLRs computed by the SPC decoder 48 represent the output of the inner decoder 36. At any other iteration they are fed back and used according to a principle known as "turbo decoding". To this purpose, they are decremented of the corresponding a priori LLRs by adder 60 to produce the extrinsic LLRs $\Lambda_e(d)$, which, in analogy with the transmitter processing, are interleaved according to the second permutation, i.e. by interleaver #2 62, and split by a splitter 64 into two sequences of length 3·n, one per polarization.

Subsequently, two soft mappers 66 compute the probabilities of the transition indices on the basis of their input LLRs as $$p_a(u) = \frac{\exp\left(\sum_{j \in I_0(u)} \Lambda_e(d_j)\right)}{[1 + \exp(\Lambda_e(d_0))] \cdot [1 + \exp(\Lambda_e(d_1))] \cdot [1 + \exp(\Lambda_e(d_2))]}, \quad (9)$$

where $d_0$, $d_1$ and $d_2$ are the bits associated with the transition index u and $I_0(u)$ is the subset of $\{0, 1, 2\}$ containing the index of the zero bits in the binary triplet associated with u according to the mapping of FIG. 2. For example, $I_0(u)=\{0, 1, 2\}$, $I_0(1)=\{\ \}$, $I_0(2)=\{0\}$, ... $I_0(7)=\{0,1\}$. The output of the soft demappers consists of eight probabilities per symbol interval and polarization, which are used as a priori probabilities during the next run of the accumulator decoder 46.

The most complex blocks in the inner decoder 36 are the accumulator decoders 46. As compared to a standard BCJR algorithm for differential encoding, as for example that employed in S. L. Howard and C. Schlegel, "*Differential turbo-coded modulation with APP channel estimation,*" *IEEE Trans. Comm.*, vol. 54, no. 8, August 2006, the proposed modification implies a higher computational burden. Although the number of states in the trellis diagram of the differential code remains eight, the introduction of a virtual input to model the cycle slips implies a four-fold increase in the number of edges. However, since in practice the carrier phase recovery generates only cycle slips by $\pm\pi/2$, the virtual input cs can be chosen, without any penalty, within the reduced set $\{0, 1, 3\}$. Thus, by disregarding the $\pi$-cycle slip, a 25% reduction of the number of trellis edges can be achieved.

As explained before, the mapping of FIG. 2 together with the addressing schemes of FIGS. 3 and 4 results into an anti-Gray mapping of the quadrant transitions, i.e. the transitions between symbols of identical amplitude. This can be easily verified by observing that whenever two transition indices differ by a multiple of 2, the Hamming distance of the associated binary triplets is two. As a consequence, each cycle slip produces the maximum number of violations in the SPC code, which helps the iterative process to localize it and correct it.

Figure 9:
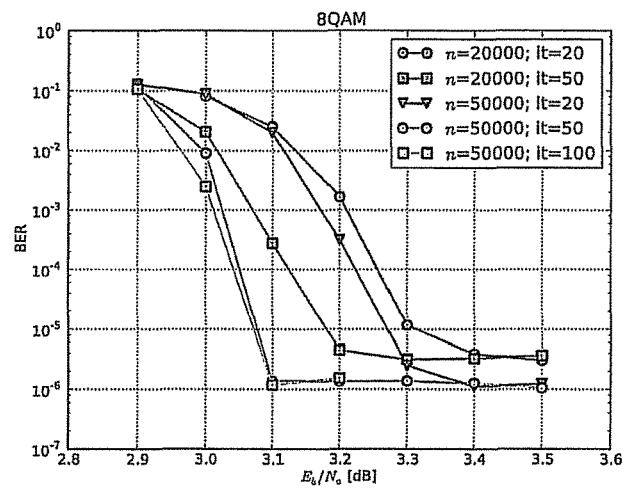

FIG. 9 shows the bit error rate (BER) as a function of energy per bit to noise spectral density $E_b/N_0$ for the 8QAM constellation diagram of FIG. 3, in absence of cycle slips, for different block lengths n (ranging from 20.000 to 50.000) and different numbers of iterations (ranging from 20 to 100).

Figure 10:
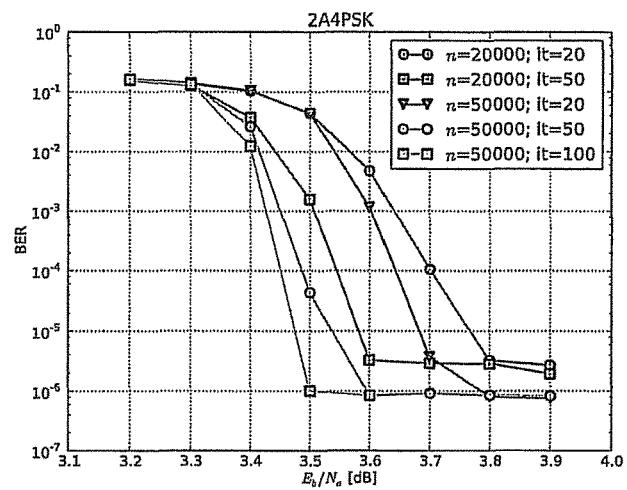

FIG. 10 shows the same type of data for the two-amplitude four-phase shift keying constellation of FIG. 4 with a randomly chosen interleaver #2 (see reference sign 62 in FIG. 2). The code shows in both cases a very steep turbo cliff, but also a pronounced error floor whose level depends on the interleaver length. A better choice of the interleaver can, however, improve the error floor. If a 16-fold byte interleaved Reed-Solomon code as described in *ITU-T Recommendation G. 709, "Interfaces for the Optical Transport Network (OTN)"*, February 2012 is used as the outer code, and the interleaver #1 (see reference sign 16 in FIG. 1) has sufficient depth, a BER of $8 \times 10^{-5}$ after the inner code is translated to a final BER of $10^{-15}$. Thus, taking into account the rate loss of approximately 0.28 dB due to the Reed-Solomon code, the whole system achieves a BER of $10^{-15}$ at a ratio of energy per bit to noise spectral density $E_b/N_0 \approx 3.3$ dB for 8QAM and $E_b/N_0 \approx 3.8$ dB for two-amplitude four-phase shift keying. Compared to the value of $E_b/N_0 \approx 15.0$ dB required by uncoded non-differential QPSK, the net coding gain (NCG) is 11.7 dB and 11.2 dB for 8QAM and for two-amplitude four-phase shift keying, respectively. The required rate overhead for the outer coding is only 255/239-1≈6.69%. Note that for QPSK the theoretical maximum NCG with this rate overhead amounts to 11.1 dB, and that the most advanced viable FEC solutions need an overhead in excess of 20% to attain an NCG of 11.7 dB.

Figure 11:
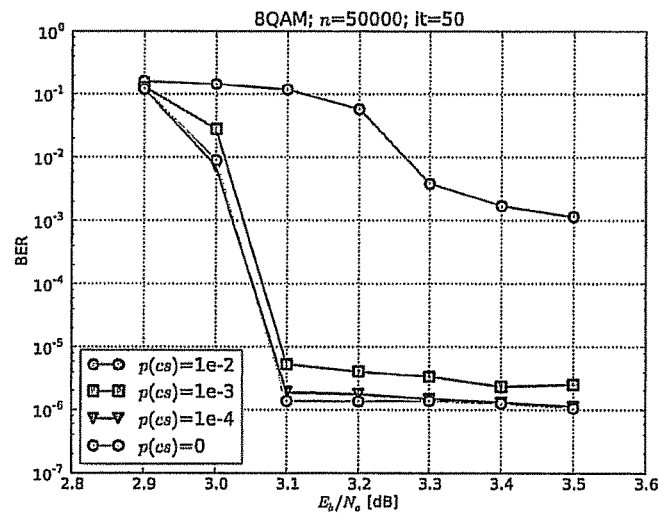
Figure 12:
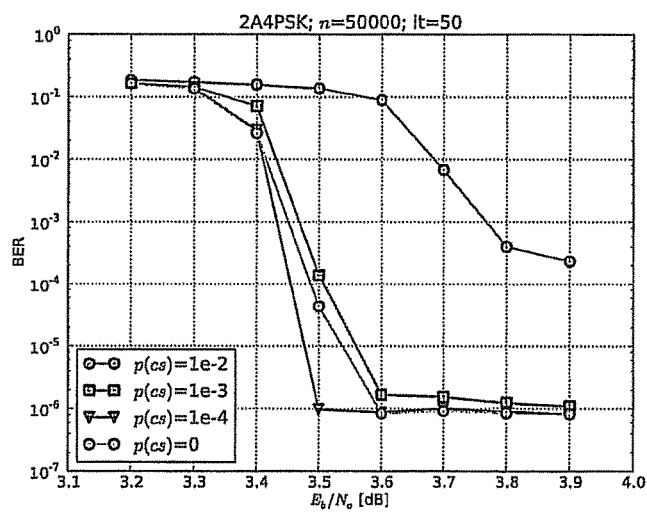

FIGS. 11 and 12 show simulation results corresponding to that of FIGS. 9 and 10, but in presence of cycle slips. Up to a cycle slip probability of $10^{-3}$, no significant performance degradation can be observed. Only at a cycle slip probability of $10^{-2}$ the algorithm starts breaking down. However, such a high cycle slip probability would only be achieved if the equivalent laser linewidth were in the range of 1% of the symbol rate, which corresponds to an absolutely unrealistic value of approximately 280 MHz. Therefore, it can be concluded that the proposed solution is practically immune to the cycle slips generated in the carrier phase recovery.

The embodiments described above and the accompanying figures merely serve to illustrate the method according to the present invention, and should not be taken to indicate any limitation of the method. The scope of the patent is solely determined by the following claims.

LIST OF ABBREVIATIONS

8PSK 8-ary Phase-Shift Keying
AWGN Additive White Gaussian Noise
BER Bit Error Rate
DWDM Dense WDM
EM Expectation-Maximization
FEC Forward Error Correction
LLR Log-Likelihood Ratio
MAP Maximum A Posteriori
NCG Net Coding Gain
PDM Polarisation Division Multiplexing
QAM Quadrature Amplitude Modulation
QPSK Quaternary Phase-Shift Keying
ROADM Reconfigurable Optical Add-Drop Multiplexer
SNR Signal-to-Noise Ratio
SPC Single Parity Check
WDM Wavelength Division Multiplexing

LIST OF REFERENCE SIGNS 10 transmitter
12 outer encoder
14 inner encoder
16 interleaver
18 SPC encoder
20 interleaver #2
22 splitter
24 differential decoder
26 mapper
28 accumulator
28' equivalent accumulator
30 mapper
32 receiver
34 units for phase recovery
36 inner decoder
38 forming block
40 de-interleaver #1
42 outer decoder
44 channel metric computers
46 accumulator decoders
48 SPC-decoder
50 cycle slip counter
52 transition-to-bits soft demapper
54 adders
56 combiner block
58 de-interleaver #2
60 adder
62 interleaver #2
64 splitter
66 soft mappers

The invention claimed is:

1. A method for decoding an optical data signal,
said optical data signal having phase and amplitude modulation according to a constellation diagram with at least eight constellation points representing non-binary symbols, said method comprising the following steps:
carrying out a carrier phase recovery of a received signal ignoring the occurrence of cycle slips, said cycle slips corresponding to unwanted abrupt phase jumps congruent with the rotational symmetry of the constellation, and
decoding said signal after carrier phase recovery, wherein in said decoding, cycle slips occurring during carrier phase recovery are modelled as virtual equivalent phase slip input to an equivalent encoder assumed by the decoding scheme, wherein said equivalent encoder operates such that for each symbol
the encoding result of the symbol with a given equivalent phase slip input, and
the encoding result of the same symbol with zero equivalent phase slip input but subjected to a true cycle slip of a phase angle corresponding to said given equivalent phase slip
is identical.

2. The method of claim 1, wherein said constellation diagram exhibits a $\pi/2$ rotational symmetry in the complex plane, and in particular corresponds to a 8QAM or a 2-amplitude 4-phase shift keying constellation.

3. The method of claim 1, wherein the decoding step comprises an iterative procedure performed by
a first soft decoder operating according to a first equivalent coding scheme on said non-binary symbols or on labels representing the same, and
a second soft decoder operating according to a second coding scheme,
said first and second soft decoders receiving probabilistic a priori input information and outputting probabilistic a posteriori information,
wherein within an iteration
an a priori input of the second soft decoder is based at least in part on an a posteriori output of the first soft decoder, and
an a priori input of the first soft decoder is based at least in part on an a posteriori output of the second soft decoder.

4. The method of claim 3, wherein the a priori input to the first soft decoder further comprises an input related to the probability of cycle slips to occur.

5. The method of claim 3, wherein the first equivalent coding scheme is a differential coding scheme operating on said non-binary symbols or associated labels, where an encoding result of each symbol depends both on the symbol and on a previous symbol.

6. The method of claim 3, wherein the first equivalent coding scheme employs, in addition to the non-binary symbol to be encoded, an equivalent cycle slip input representing a corresponding cycle slip angle, wherein the first equivalent coding scheme on which the first soft decoder operates is such that for each symbol
an encoding result of the symbol with a given equivalent cycle slip input, and
an encoding result of the same symbol encoded with zero equivalent cycle slip input but subjected to a true cycle slip of said cycle slip angle, are identical.

7. The method of claim 3, wherein said constellation diagram comprises 4n constellation points consisting of n groups of four constellation points having identical amplitude and phase differences of multiples of $\pi/2$,
wherein said constellation points are labelled by integer numbers $\{0, 1, \ldots, 4n-1\}$, wherein said labels are chosen such that for each two labels i, j corresponding to constellation points of a same group, where a phase of constellation point i differs from the phase of constellation point j by $\pi/2$, the following relation applies: j=i+n MOD(4n), and
wherein said first soft decoder operates on said labels.

8. The method of claim 3, wherein the first soft decoder employs a Maximum A Priori (MAP) symbol-by-symbol decoding.

9. The method of claim 3, wherein said first soft decoder outputs a posteriori probabilities for equivalent cycle slips, and wherein probabilities of particular cycle slips to occur are determined based on statistics of said outputted a posteriori probabilities of equivalent cycle slips.

10. The method claim 3, wherein said second coding scheme is a binary error control coding scheme.

11. The method of claim 3, wherein the information exchanged between the first and the second soft decoders is interleaved and de-interleaved, respectively.

12. The method of claim 3, wherein the decoding further employs a mapping between said non-binary symbols or labels representing the same and a bit sequence, wherein the mapping is chosen such that of any two symbols of identical amplitude and with a phase difference of $\pi/2$, the corresponding bit sequence differs
in at least two bit positions and/or
on average by more than half of the bit positions.

13. The method of claim 1, wherein the decoding is carried out simultaneously for two different polarizations of said data signal.

14. The method of claim 13, wherein said method employs two of said first soft decoders, each receiving probabilistic information about non-binary symbols transmitted in a respective one of said two polarizations.

15. The method of claim 14, wherein the a posteriori outputs of the two first soft decoders, or data derived from said a posteriori outputs of the two first soft decoders, are combined prior to being inputted to the second soft decoder, and wherein the a posteriori output of the second soft decoder, or data derived from said a posteriori output of the second soft decoder, is split into two portions for input into a respective one of said first soft decoders.

16. The method of claim 1, wherein the aforementioned decoding is an inner decoding, which is followed by an outer decoding according to an outer coding scheme providing for forward error correction with an overhead of less than 15%, preferably less than 10% and most preferably less than 7%.

17. A receiver for receiving and decoding an optical data signal, said optical data signal having phase and amplitude modulation according to a constellation diagram with at least eight constellation points representing non-binary symbols, said receiver comprising:
at least one phase recovery unit for carrying out a carrier phase recovery of a received signal ignoring the occurrence of cycle slips, said cycle slips corresponding to unwanted abrupt phase jumps congruent with the rotational symmetry of the constellation, and
a decoder for decoding said signal after carrier phase recovery, wherein the decoder is configured such that in said decoding, cycle slips occurring during carrier phase recovery are modelled as virtual equivalent phase slip input to an equivalent encoder assumed by the decoding scheme, wherein said equivalent encoder operates such that for each symbol
the encoding result of the symbol with a given equivalent phase slip input, and
the encoding result of the same symbol with zero equivalent phase slip input but subjected to a true cycle slip of a phase angle corresponding to said given equivalent phase slip
is identical.

18. The receiver of claim 17, wherein the decoder comprises
a first soft decoder operating according to a first equivalent coding scheme on said non-binary symbols or on labels representing the same, and
a second soft decoder operating according to a second coding scheme,
wherein said first and second soft decoders are configured to receive probabilistic a priori input information and to output probabilistic a posteriori information,
wherein said decoder is configured to carry out an iterative procedure, in which within an iteration
an a priori input of the second soft decoder is based at least in part on an a posteriori output of the first soft decoder, and
an a priori input of the first soft decoder is based at least in part on an a posteriori output of the second soft decoder.

19. The receiver of claim 18, wherein the a priori input to the first soft decoder (46) further comprises an input related to the probability of cycle slips to occur.

20. The receiver of claim 17, wherein the first equivalent coding scheme is a differential coding scheme operating on said non-binary symbols or associated labels, where the encoding result of each symbol depends both on the symbol itself and on the previous symbol, and in particular an accumulator.

21. The receiver of claim 17, wherein said second coding scheme is a binary error control coding scheme.

22. The receiver of claim 17, wherein said decoder is configured to carry out a decoding method according to claim 1.

23. The receiver of claim 17, wherein the aforementioned decoder is an inner decoder, wherein the receiver further comprises an outer decoder operating according to an outer coding scheme providing for forward error correction with an overhead of less than 15%, preferably less than 10% and most preferably less than 7%.

* * * * *